(12) United States Patent
Rakich et al.

(10) Patent No.: US 12,030,085 B2
(45) Date of Patent: Jul. 9, 2024

(54) ACOUSTO-OPTIC COUPLING TECHNIQUES AND RELATED SYSTEMS AND METHODS

(71) Applicant: Yale University, New Haven, CT (US)

(72) Inventors: Peter Rakich, New Haven, CT (US); Prashanta Kharel, Cambridge, MA (US); William Renninger, Rochester, NY (US); Ryan Orson Behunin, Flagstaff, AZ (US)

(73) Assignee: Yale University, New Haven, CT (US)

( * ) Notice: Subject to any disclaimer, the term of this patent is extended or adjusted under 35 U.S.C. 154(b) by 1357 days.

(21) Appl. No.: 16/488,223

(22) PCT Filed: Feb. 28, 2018

(86) PCT No.: PCT/US2018/020197
§ 371 (c)(1),
(2) Date: Aug. 22, 2019

(87) PCT Pub. No.: WO2018/160679
PCT Pub. Date: Sep. 7, 2018

(65) Prior Publication Data
US 2020/0030849 A1 Jan. 30, 2020

Related U.S. Application Data (60) Provisional application No. 62/465,104, filed on Feb. 28, 2017.

(51) Int. Cl.
*B06B 1/04* (2006.01)
*G02F 1/11* (2006.01)
(Continued)

(52) U.S. Cl.
CPC ............. *B06B 1/04* (2013.01); *G10K 15/00* (2013.01); *H01S 3/08059* (2013.01); *H03F 3/00* (2013.01); *G02F 1/11* (2013.01)

(58) Field of Classification Search
CPC ....... B06B 1/04; G10K 15/00; H01S 3/08059; H03F 3/00; G02F 1/11
(Continued)

(56) References Cited

U.S. PATENT DOCUMENTS 5,835,512 A * 11/1998 Wada .................... H01S 3/1068
372/27
8,525,619 B1 * 9/2013 Olsson ............... H03H 9/02228
333/187

(Continued)

OTHER PUBLICATIONS

International Search Report and Written Opinion for International Application No. PCT/US2018/020190 dated May 30, 2018.
(Continued)

*Primary Examiner* — Sharrief I Broome
(74) *Attorney, Agent, or Firm* — Wolf, Greenfield & Sacks, P.C.

(57) ABSTRACT

Techniques are provided to optomechanically couple light to a crystal structure, thereby producing stable, coherent bulk acoustic modes within the structure. In some embodiments, a resonator may comprise a plano-convex crystal structure to which pump light may be applied. The pump light may transfer energy to acoustic phonon modes of the crystal structure so as to create acoustic phonon modes with a coherence length greater than a length of the crystal structure. High frequency and high quality factor resonators may thereby be produced and operated.

20 Claims, 9 Drawing Sheets

(51) Int. Cl.
    *G10K 15/00*    (2006.01)
    *H01S 3/08*     (2023.01)
    *H03F 3/00*     (2006.01)

(58) Field of Classification Search
    USPC ........................................................ 359/285
    See application file for complete search history.

(56) References Cited

U.S. PATENT DOCUMENTS

| | | | | |
|---|---|---|---|---|
| 8,600,200 | B1* | 12/2013 | Rakich | G02F 1/0126 |
| | | | | 385/7 |
| 9,503,063 | B1* | 11/2016 | Abraham | H10N 60/815 |
| 10,573,800 | B1 | 2/2020 | Najafi | |
| 2014/0112107 | A1 | 4/2014 | Guo et al. | |
| 2016/0125309 | A1 | 5/2016 | Naaman et al. | |
| 2016/0148112 | A1 | 5/2016 | Kwon | |
| 2017/0219901 | A1* | 8/2017 | Kumai | G03B 11/00 |
| 2020/0234171 | A1 | 7/2020 | Chu et al. | |
| 2020/0412457 | A1 | 12/2020 | Bronn et al. | |

OTHER PUBLICATIONS

International Search Report and Written Opinion for International Application No. PCT/US2018/020197 dated May 29, 2018.

Cleland et al., Superconducting qubit storage and entanglement with nanomechancial resonators. Phys Rev Lett. 2004;93(7):070501.

Devoret et al., Superconducting Circuits for Quantum Information: An Outlook. Science. Mar. 8, 2013;339:1169-74. doi: 10.1126/science.1231930.

Gustaffson et al., Propgating phonons coupled to an artificial atom. Science. 2014;346:207-1.

Han et al., Multimode strong coupling in superconducting cavity piezoelectromechanics. Phys Rev Lett. 2016;117:123603.

Hofheinz et al., Synthesizing arbitrary quantum states in a superconducting resonator. Nature. May 28, 2009;459:546-9. doi: 10.1038/nature08005.

Lahaye et al., Nanomechanical measurements of a superconducting qubit. Nature. 2009;459:960-4.

Paik et al., Observation of High Coherence in Josephson Junction Qubits Measured in a Three-Dimensional Circuit QED Architecture. Phys Rev Lett. Dec. 5, 2011;107(24):240501. arXiv:1105.4652v4. 5 pages.

Rakich et al., Quantum theory of continuum optomechancis. New J Phys. 2018;20:045005.

Renninger et al., Bulk crystalline optomechanics. Nature Physics. 2018; 14(6):601.

Rouxinol et al., Measurements of nanoresonator-qubit interactions in a hybrid quantum electromechanical system. Nanotechnology. 2016;27:364003.

Zou et al., Cavity piezomechanical strong coupling and frequency conversion on an aluminum nitride chip. Phys Rev A. 2016;94:013812.

U.S. Appl. No. 16/488,215, filed Aug. 22, 2019, Chu.

International Preliminary Report on Patentability for International Application No. PCT/US2018/020190, dated Sep. 12, 2019.

International Preliminary Report on Patentability for International Application No. PCT/US2018/020197, dated Sep. 12, 2019.

Extended European Search Report for European Application No. 18760512.6, dated Nov. 26, 2020.

O'Connell et al., Quantum ground state and single-phonon control of a mechanical resonator. Nature. 2010;464:697-703.

O'Connell et al., Quantum ground state and single-phonon control of a mechanical resonator—Supplementary Information. Nature. 2010;464:697-703.

* cited by examiner

ACOUSTO-OPTIC COUPLING TECHNIQUES AND RELATED SYSTEMS AND METHODS

CROSS-REFERENCE TO RELATED APPLICATIONS

This Application is a national stage filing under 35 U.S.C. § 371 of International Patent Application Serial No. PCT/US2018/020197, filed Feb. 28, 2018, which claims priority under 35 USC 119(e) to U.S. Provisional Application Ser. No. 62/465,104, filed Feb. 28, 2017. The entire contents of these applications are incorporated herein by reference in their entirety.

STATEMENT REGARDING FEDERALLY-SPONSORED RESEARCH AND DEVELOPMENT

This invention was made with government support under 1119826 awarded by National Science Foundation. The government has certain rights in the invention.

BACKGROUND

Acoustic resonators have become a key technology in a number of different industries, including wireless devices, data transfer devices and satellite communications. Such resonators often comprise a crystal material such as quartz, which can be driven to oscillate at a desired frequency via the piezoelectric effect by applying an electric field to the crystal. Various resonator designs exist based on this principle, including crystals and numerous thin film resonator designs.

SUMMARY

According to some aspects, a resonator is provided comprising a plano-convex crystal structure having at least a planar face and a convex face, at least one pump input arranged to supply light to the planar face of the plano-convex crystal structure, and at least one controller configured to direct light onto the planar face of the plano-convex crystal structure via the at least one pump input such that the light propagates through the plano-convex crystal structure from the planar face to the convex face and produces a coherent acoustic phonon mode across the plano-convex crystal structure.

According to some embodiments, the light includes light of a first frequency and the plano-convex crystal structure is transparent to at least light of the first frequency.

According to some embodiments, the plano-convex crystal structure is transparent to visible light.

According to some embodiments, the resonator further comprises a cryogenic system thermally coupled to the plano-convex crystal structure and configured to cool the plano-convex crystal structure to a temperature below 50 K.

According to some embodiments, the plano-convex crystal structure comprises $TeO_2$ and/or $SiO_2$.

According to some embodiments, the plano-convex crystal structure comprises z-cut quartz.

According to some embodiments, the plano-convex crystal structure comprises diamond and/or sapphire.

According to some embodiments, the at least one pump input comprises an optical fiber.

According to some embodiments, the resonator further comprises at least one probe input arranged to supply light to the convex face of the plano-convex crystal structure.

According to some embodiments, the at least one probe input and the at least one pump input are configured to supply co-polarized light to the plano-convex crystal structure.

According to some embodiments, the resonator further comprises a wafer, and portions of two opposing faces of the wafer form the plano-convex crystal structure.

According to some aspects, a method is provided of producing coherent acoustic phonon modes within a plano-convex crystal structure having a planar face and a convex face, the method comprising supplying pump light to the planar face of the plano-convex crystal structure such that the pump light propagates through the plano-convex crystal structure from the planar face to the convex face and produces a coherent acoustic phonon mode across the plano-convex crystal structure.

According to some embodiments, the acoustic phonon mode has a frequency above 1 GHz.

According to some embodiments, the pump light includes light of a first frequency and the plano-convex crystal structure is transparent to at least light of the first frequency.

According to some embodiments, the plano-convex crystal structure is transparent to visible light.

According to some embodiments, the plano-convex crystal structure comprises $TeO_2$ and/or $SiO_2$.

According to some embodiments, a coherence length of the coherent acoustic phonon mode is greater than a length of the plano-convex crystal structure as measured from the planar face to the convex face of the crystal.

According to some embodiments, the method further comprises supplying probe light to the convex face of the plano-convex crystal structure, wherein the pump light is of a first frequency and the probe light is of a second frequency, and wherein the first frequency and second frequency are different.

According to some embodiments, the probe light and the pump light are co-polarized.

According to some embodiments, the method further comprises selecting the first frequency and the second frequency based at least in part on a Brillouin frequency of the plano-convex crystal structure.

The foregoing apparatus and method embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

DETAILED DESCRIPTION

The inventors have recognized and appreciated techniques to optomechanically couple light to a crystal structure, thereby producing stable, coherent bulk acoustic modes within the structure. By supplying light to the crystal structure in a particular manner, high frequency (e.g., >10 GHz) acoustic modes can be produced in the crystal that can have a coherence length larger than the crystal's length, and in some cases many times longer. A high frequency and high quality factor resonator may thereby be produced and operated.

According to some embodiments, a resonator may comprise a crystal structure configured to have a plano-convex shape. Such a geometry may enable, by application of suitable light to the crystal structure, the formation of standing acoustic phonon waves across the structure with little to no diffraction losses. In comparison, supplying light to a crystal structure having opposing planar faces may not produce a stable resonance because such a geometry may not support stationary acoustic modes that are finite in lateral extent. As discussed further below, particular plano-convex geometries may be particularly advantageous in such a resonator. A plano-convex crystal structure may be fabricated as an independent plano-convex shape or may be arranged within a larger structure such as a wafer.

According to some embodiments, acoustic modes in a crystal structure may be accessed by supplying pump light, such as laser light, to a face of the crystal structure. In the case where the crystal structure is a plano-convex crystal structure, the pump light may be supplied to a planar face of the structure. Particular frequencies of the pump light may stimulate acoustic modes within the resonator as discussed further below. Optionally, probe light may simultaneously be supplied to a face of the crystal structure opposing the face at which pump light is supplied. For instance, in the case where the crystal structure is a plano-convex structure, the probe light may be supplied to a convex face of the structure. Frequencies of the pump light and probe light may be selected to stimulate acoustic modes within the resonator as discussed further below. In particular, a difference between the frequencies of the pump light and probe light may be selected.

According to some embodiments, a crystal structure may be transparent at least to a wavelength of pump light supplied to the structure. While the resonator may be fabricated from one or more materials that are optically transparent to visible light, it may be sufficient for the resonator to be transparent only to those wavelengths of light supplied to the resonator via pump and/or probe light sources. Pump and/or probe light passing through the crystal structure may transfer energy to acoustic phonon modes within the structure as the light traverses the length of the structure.

Following below are more detailed descriptions of various concepts related to, and embodiments of, techniques for optomechanically coupling light to a crystal. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

Figure 1:
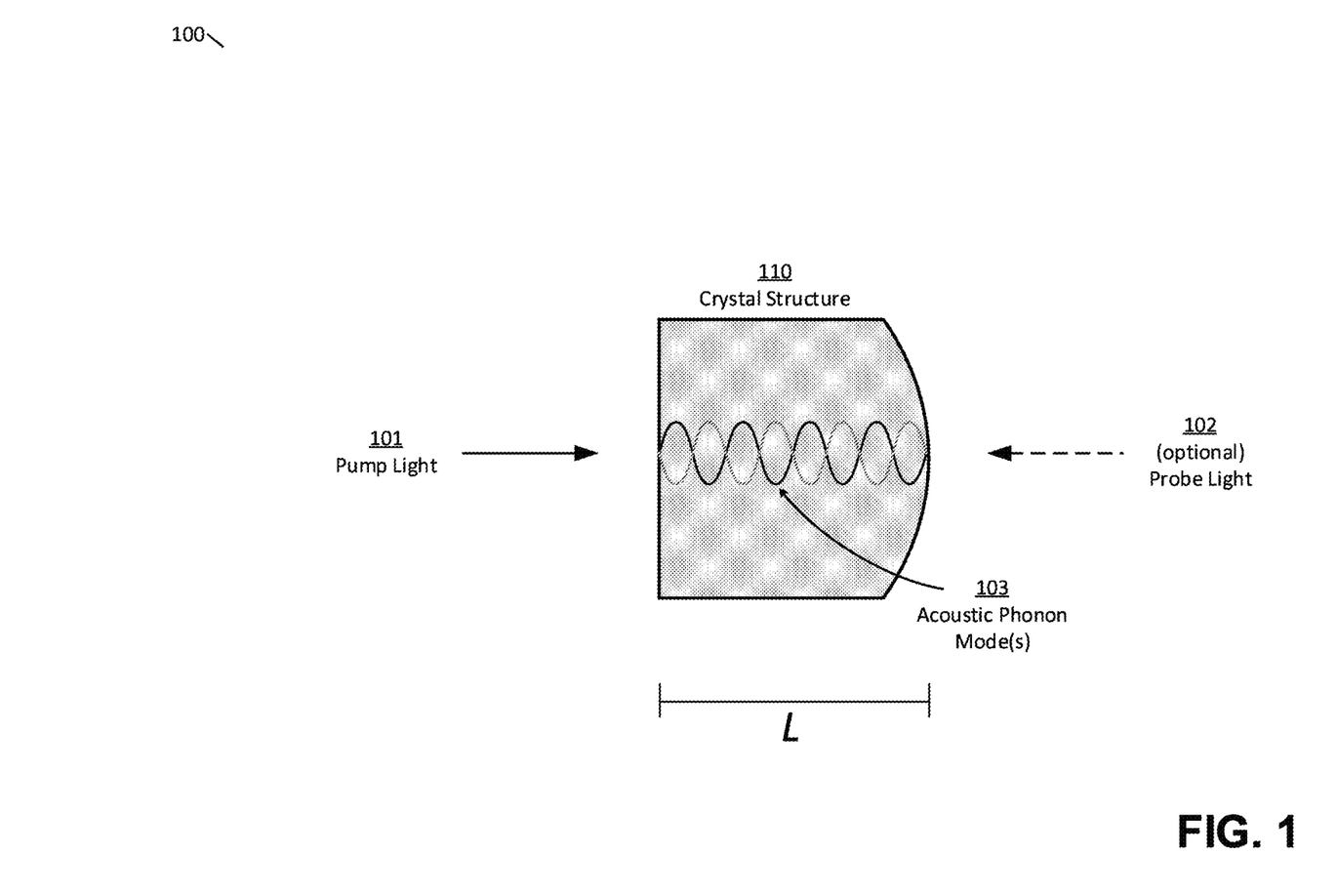
FIG. 1 depicts a crystal structure having a plano-convex shape, according to some embodiments.

FIG. 1 depicts a crystal structure having a plano-convex shape, according to some embodiments. Resonator 100 includes a plano-convex crystal structure 110 to which pump light 101 is applied at the planar face and, optionally, to which probe light 102 is applied at the convex face. As will be described further below, particular configurations of the pump light (and in some embodiments, the pump light and the optional probe light) may stimulate acoustic phonon modes 103 within the crystal structure 110 that have a coherence length at least as great as the length L of the crystal structure.

According to some embodiments, the material(s) from which crystal structure 110 is formed may be transparent to at least the pump light 101 (which may comprise light of one or more frequencies). In some embodiments, the material(s) may be transparent to all light across the visible spectrum. As a non-limiting list of possible materials, crystal structure 110 may be formed from quartz (e.g., z-cut quartz), diamond, sapphire, $TeO_2$, $SiO_2$, silicon (e.g., x-cut silicon) or combinations thereof. According to some embodiments, the crystal structure 110 may have a length L between 10 µm and 10 mm, or between 20 µm and 100 µm, or between 20 µm and 1 mm, or between 50 µm and 2 mm, or between 3 mm and 8 mm.

According to some embodiments, crystal structure 110 may be part of a larger structure not depicted in FIG. 1. For instance, a wafer may be configured with a convex region such that the convex region and the opposing planar side of the wafer form the plano-convex crystal structure 110. In this manner, the depicted crystal structure 110 may be seen as highlighting only a section of a larger structure. An example of such a structure is discussed below in relation to FIG. 6.

According to some embodiments, pump light 101 and/or optional probe light 102 may comprise laser light. Such laser light may include any suitable wavelength(s) of light, such as near infrared light, infrared light, and/or visible light. In some embodiments, pump light 101 and probe light 102 may be configured to have the same polarization—that is, to be co-polarized. According to some embodiments, the pump light 101 and/or probe light 102 may comprise monochromatic light. Irrespective of the nature of pump light 101 (and optionally probe light 102), the light may be supplied to the crystal structure via any suitable means, including by optical fiber, and may be passed through any number of suitable gratings, collimators, lens, and/or other optical components prior to incident upon the crystal structure.

As will be discussed further below, pump light 101 and probe light 102 (in embodiments in which the optional probe light 102 is provided) may comprise frequencies of light that are different to one another. In some embodiments, a difference between these frequencies may be selected based on a desired acoustic phonon mode. In some embodiments, a frequency of the pump light 101 may be selected based on a desired acoustic phonon mode frequency. In some embodiments, frequencies of the pump light 101 and probe light 102 may be selected according to phase matching and energy conservation conditions as described below.

Figure 2A:
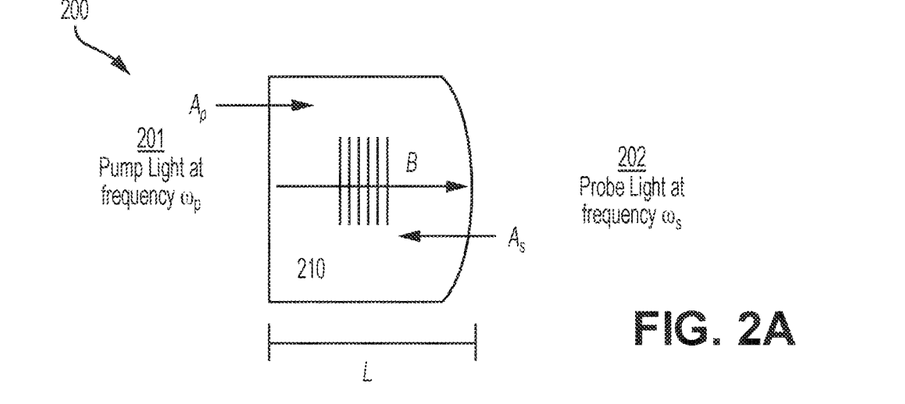
FIG. 2A depicts phonon scattering from incident light within a plano-convex crystal structure at room temperature, according to some embodiments.

Stimulated Brillouin scattering is a nonlinear scattering process involving optical and acoustic waves. This process occurs when two counter propagating optical waves in a medium generate an optical beat pattern which then produces periodic density variation and refractive index modulation through electrostriction and photoelasticity respectively. FIG. 2A depicts counter propagating pump and probe optical waves (201 and 202, respectively) propagating through a crystal structure 210. In the example of FIG. 2A, the crystal structure 210 has a plano-convex shape and is transparent to the pump light 201 and the probe light 202, thereby allowing both to propagate through the crystal structure in opposing directions.

According to some embodiments, based on the relative frequencies of optical waves 201 and 202, the waves may generate a moving density wave within the crystal which, acting like a moving Bragg grating, Doppler shifts and back-scatters the pump light to the probe light propagating through the crystal in the opposing direction (the probe light is also referred to herein as "Stokes light" due to its enhancement via Stokes processes). Resonant enhancement of both the acoustic waves and also the back-scattered Stokes light can occur when the frequency detuning between light 201 and 202 (i.e., the difference between their respective frequencies) is such that the velocity of the beat pattern moves at the velocity of the acoustic waves.

In a backward scattering geometry, a forward moving pump photon with frequency and wave-vector $(\omega_p, k(\omega_p))$ is scattered to a backward moving Stokes photon $(\omega_s, -k(\omega_s))$ and a forward moving acoustic phonon $(\Omega, q(\Omega))$. Here, $k(\omega)=\omega/v_o(q(\Omega)=\Omega/v_a)$ is the frequency-dependent optical (acoustic) wavevector and $v_o(v_a)$ is the phase velocity of light (sound) within the crystal. For resonant energy transfer, the optical and acoustic waves involved in Brillouin scattering satisfy energy conservation and phase matching requirements $\omega_p=\omega_s+\Omega$, or equivalently:

$$\Omega=\omega_p-\omega_s;$$

$$k(\omega_p)=-k(\omega_s)+q(\Omega). \quad \text{(Eqn. 1)}$$

Figure 2B:
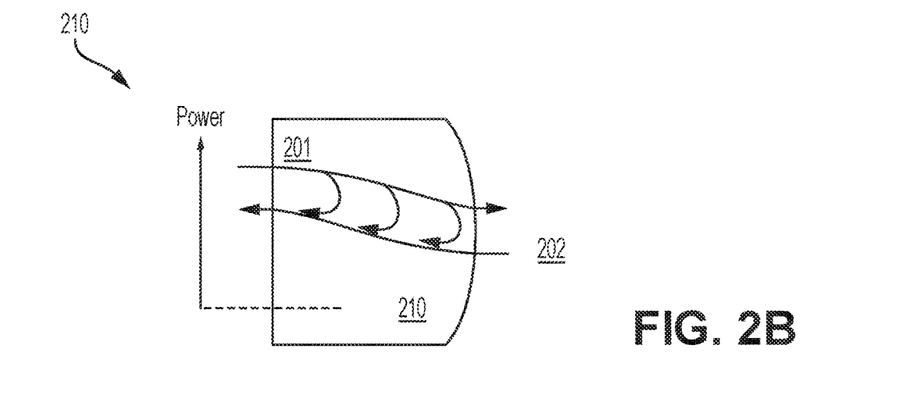
FIG. 2B illustrates energy transfer between the pump light and probe light incident upon the crystal structure of FIG. 2A, according to some embodiments.

These requirements along with the dispersion relations (which may be assumed to be linear for a bulk system) set the frequency for a resonant Brillouin energy transfer. When these requirements are met, therefore, energy may be transferred from the pump light and/or probe light into the acoustic phonon system. This transfer in turn mediates energy transfer from the pump light to the probe light, as illustrated in FIG. 2B.

Figure 2C:
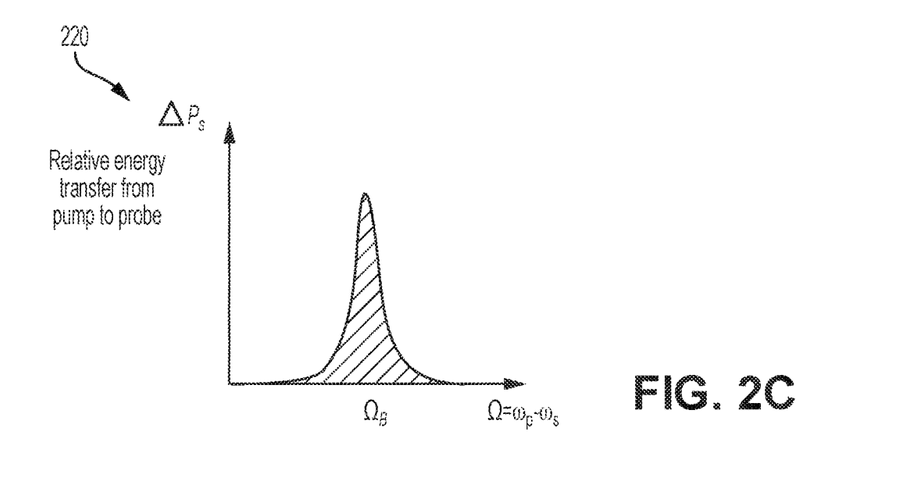
FIG. 2C is a chart of relative energy transfer between the pump light and probe light incident upon the crystal structure of FIG. 2A as a function of the difference in frequency between the pump light and probe light, according to some embodiments.

FIG. 2C illustrates a spectrum of this energy transfer as a relative change in probe light power as a function of $\Omega$, which as discussed above is the difference between the frequencies of the pump and probe (Stokes) light. When this difference is equal to a particular value $\Omega_B$, referred to herein as the Brillouin frequency, there is resonant energy transfer into the acoustic phonon system and as a result there is energy transfer from the pump to the probe. This energy transfer falls off as the detuning between the pump and probe light is moved away from the Brillouin frequency $\Omega_B$. The Brillouin frequency may be estimated as $$\Omega_B \cong 2\omega_p(v_a/v_o) \quad \text{(Eqn. 2)}$$

Since $v_o$ and $v_a$ will generally be different for different materials, the ratio between the pump light frequency and the Brillouin frequency will be different for each material. Having said that, in typical materials and for near-infrared wavelengths of incident pump light, the Brillouin frequency is generally between 10 GHz and 70 GHz.

Figure 3A:
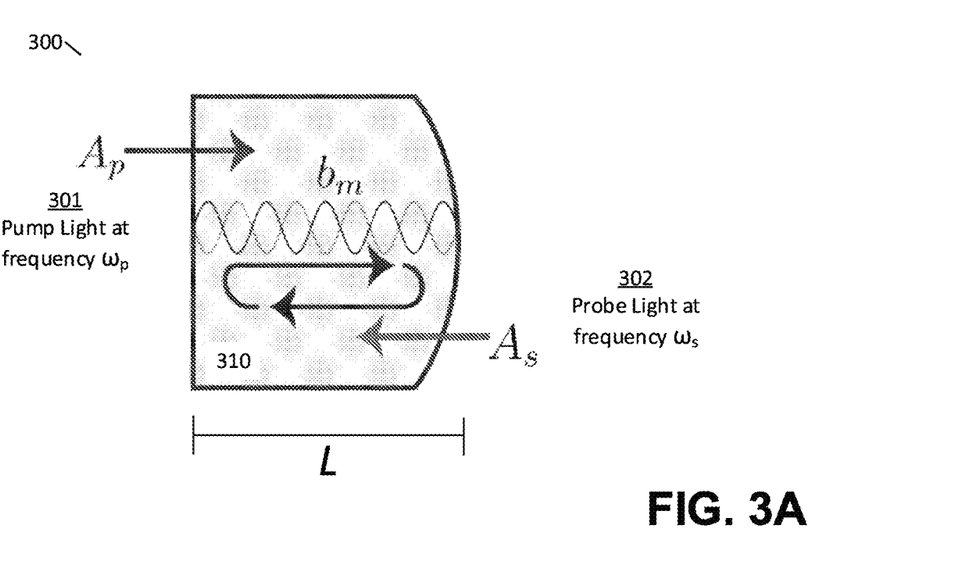
FIG. 3A depicts acousto-optic interactions within a plano-convex crystal structure at low temperature, according to some embodiments.

At room temperatures, the phonon waves created through the above-described processes decay rapidly, however, and have a coherence length on the order of tens or hundreds of microns. At cryogenic temperatures, such as between 5 K and 15 K, the phonons instead may become suitably coherent that their coherence length exceeds the size of the crystal structure, and may be many times longer—such as on the order of meters. FIG. 3A depicts acousto-optic interactions within a plano-convex crystal structure at low temperature, according to some embodiments.

In the example of FIG. 3A, a plano-convex crystal structure receives incident pump light 301 and incident probe light 302, which for certain relative frequencies of the pump and probe light produce resonant behavior creating phonon waves in the crystal structure 310. As discussed above, the criteria for resonant behavior is centered around a phase-matching condition $\Omega_B=\omega_p-\omega_s$ where $\Omega_B \cong 2\omega_p(v_a/v_o)$. In contrast to FIG. 2A, however, the low temperatures in the system of FIG. 3A mean that acoustic waves with a long coherence length may reflect off the edges of the crystal structure to form standing wave phonon modes.

The actual set of standing wave phonon modes within the phase-matching bandwidth for system 300 not only depends on the geometry of the crystal structure 310 (e.g., the shape of the boundaries of the crystal structure) but also on the anisotropy of the crystal. Frequencies of these standing wave acoustic modes in 1D can be approximately calculated by fitting acoustic half-wavelengths $\lambda_a$ inside the crystal length L (i.e., $m\lambda_a/2=L$). So the frequency of the $m^{th}$ acoustic mode assuming a linear acoustic dispersion $(q(\Omega)=\Omega/v_a)$ is $\Omega_m=2\pi\times(mv_a)/(2L)$, where $v_a$ is the longitudinal sound velocity.

Figure 3B:
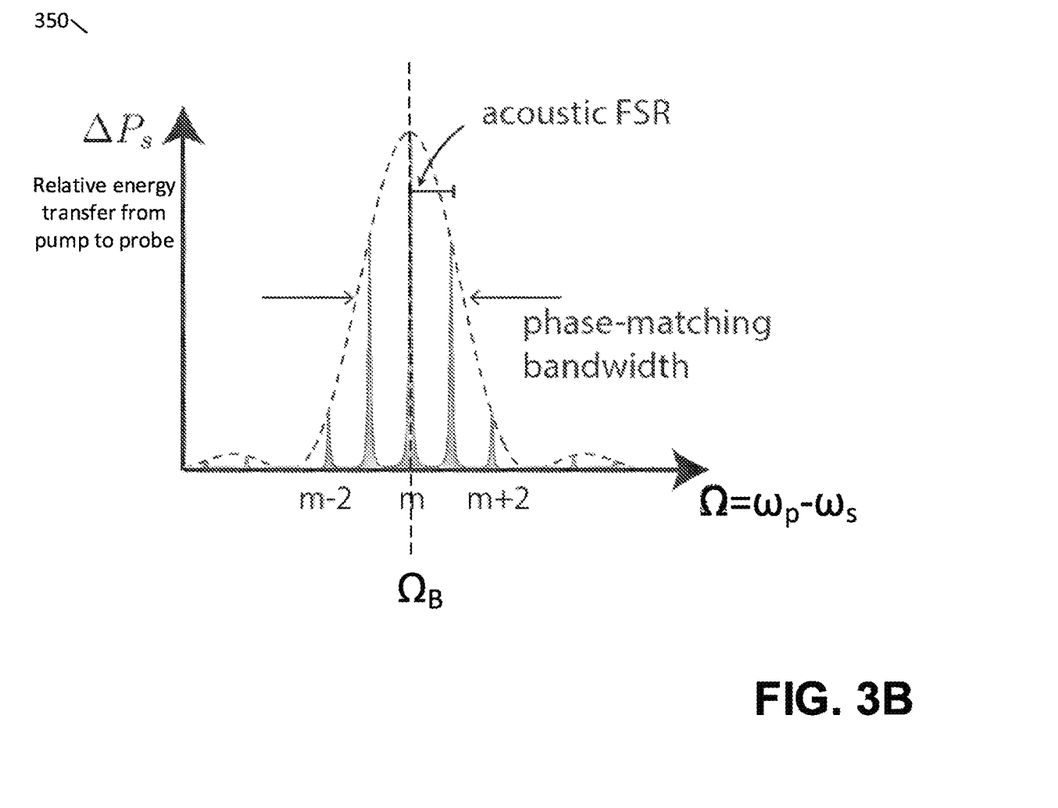
FIG. 3B is a chart of relative energy transfer between the pump light and probe light incident upon the crystal structure of FIG. 3A as a function of the difference in frequency between the pump light and probe light, according to some embodiments.

In the limit of weak signal gain and undepleted pump (i.e., $\Delta P_s(0) \ll P_s(L)$ and $A_p(z) \approx A_p(0) \approx$ constant, where $A_p$ is an amplitude of the pump light), the following equation for the acoustic mode amplitude and the Stokes power change for a crystalline medium of length L may be derived:

$$\bar{b}_m \simeq (\bar{g}_o^m)^* L \frac{\bar{A}_p(0)\bar{A}_s^*(L)}{\left(\Omega - \Omega_m + i\frac{\Gamma_m}{2}\right)} e^{-i\frac{\Delta qL}{2}} Sinc\left(\frac{\Delta qL}{2}\right)$$

$$\Delta P_s(L) = P_s(0) - P_s(L) \approx$$

$$P_p(0)P_s(L) \sum_m \frac{4|\bar{g}_o^m|^2 L^2}{\hbar\omega_p v_o^2 \Gamma_m} \frac{(\Gamma_m/2)^2}{(\Omega - \Omega_m)^2 + (\Gamma_m/2)^2} Sinc^2\left(\frac{\Delta qL}{2}\right)$$

where $A_s$ is an amplitude of the probe light, $\Gamma_m$ is the phonon dissipation rate of the $m^{th}$ phonon mode, $\Omega_m$ is the frequency of the $m^{th}$ phonon mode, $\bar{g}_o^m$ is the electrostrictive coupling rate of the optical fields to the $m^{th}$ phonon mode, and where the phase mismatch $\Delta q_m = q_m - k_p - k_s \simeq \Omega_m/v_a - 2\omega_p/v_o$. The spectrum in this case, as shown in FIG. 3B, is markedly different than just the Lorentzian response obtained in the low coherence limit as shown in FIG. 2C.

As shown in the example of FIG. 3B, the spectrum of relative energy transfer from the pump light 301 to the probe light 302 within the crystal includes a set of discrete peaks within an envelope produced according to the phase matching conditions (shown as a dashed line in FIG. 3B). These modes have an acoustic free spectral range (FSR) of $\pi v_a/L$ (shown in FIG. 3B), and are labeled in FIG. 3B with mode numbers m−2, m−1, m, m+1, m+2, . . . .

Experiments have shown that tuning the pump and probe light frequencies to respect the phase-matching conditions discussed above in a plano-convex crystal can produce phonon modes with a coherence length on the order of meters, at phonon frequencies above 10 GHz, and with a quality factor (Q) exceeding $10^7$. The resulting frequency/quality-factor product of greater than $10^{17}$ is comparable with world-class electromechanical devices.

Figure 4:
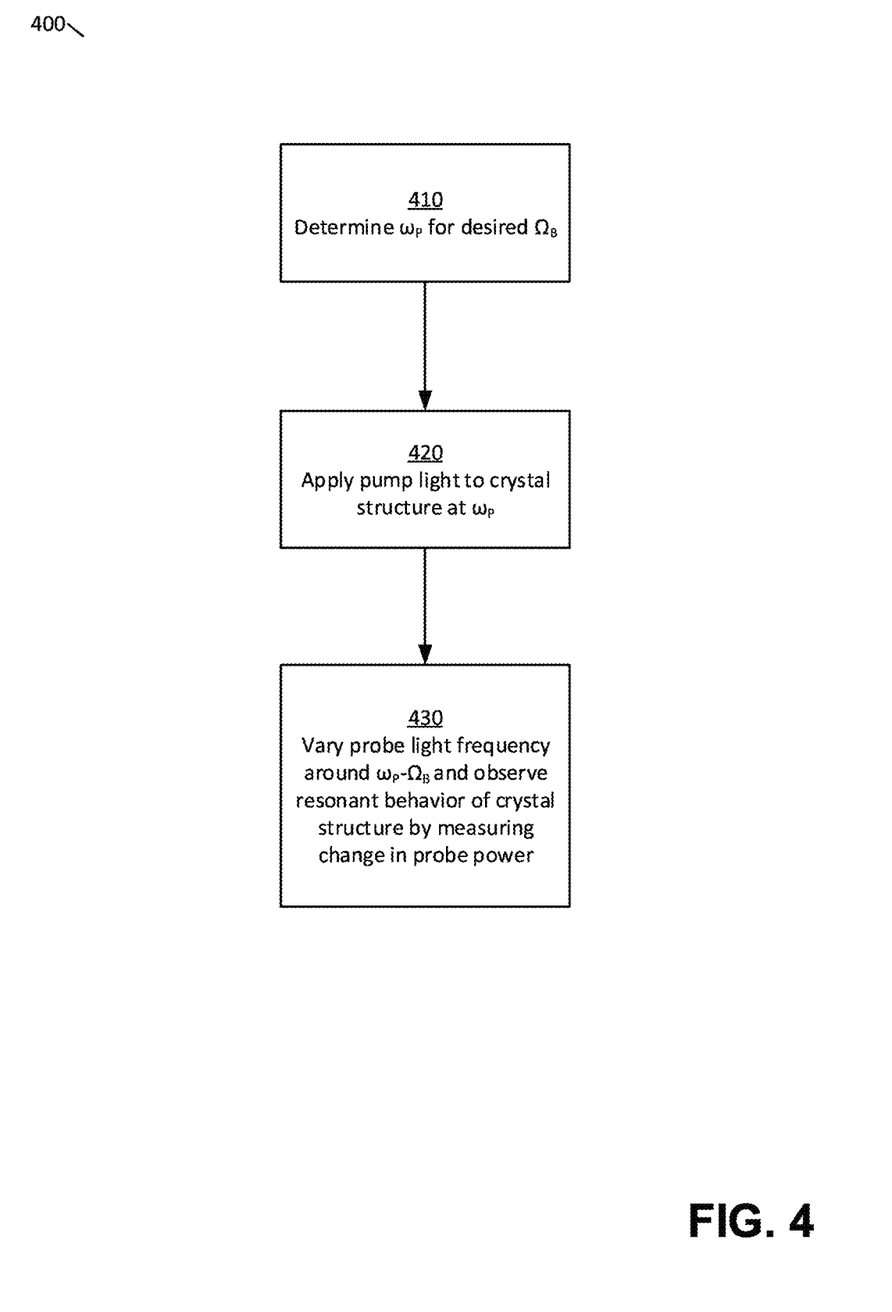
FIG. 4 is a flowchart of a method of identifying acoustic resonance frequencies of a crystal resonator, according to some embodiments.

To tune the pump light and probe light frequencies in the low temperature regime shown in FIGS. 3A-3B involves not only tuning according to the phase matching conditions but also precisely tuning the relative frequencies $\Omega = \omega_p - \omega_s$ to one of the acoustic phonon modes that lie within the phase-matching bandwidth as shown in FIG. 3B. FIG. 4 is a flowchart of a method of identifying resonant frequencies of a crystal resonator in this manner, according to some embodiments. For purposes of illustration, the method of FIG. 4 will be described in the context of resonator system 100 shown in FIG. 1.

Method 400 begins in act 410 in which an appropriate pump light frequency 101 is determined for a desired acoustic phonon frequency. As discussed above, these quantities are related by:

$$\Omega_B \simeq 2\omega_p(v_a/v_o) \quad \text{(Eqn. 2)}$$

As such, based on the speed of sound and light within the crystal structure 110 (which depends on physical properties of the material or materials that make up the structure), the appropriate value of $\omega_p$ may be selected for the desired Brillouin frequency $\Omega_B$. In act 420, pump light 101 at the frequency $\omega_p$ is applied to the crystal structure.

In act 430, probe light 102 is applied at a frequency $\omega_s$ selected to be at or close to $\omega_p - \Omega_B$, and the probe light frequency varied whilst the power of probe light that has passed through the crystal is measured to determine whether an acoustic resonance exists at the present pump and probe light frequencies. During this process, the frequency of the pump light 101 may be fixed. An illustrative experimental configuration for performing method 400 is discussed below in relation to FIG. 6.

Figure 5A:
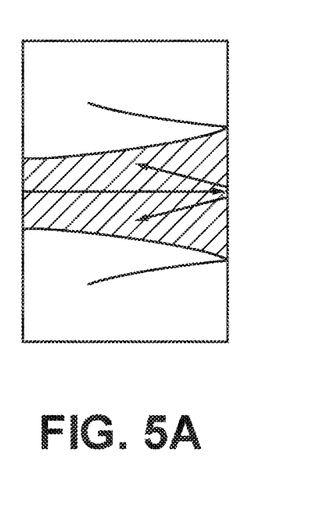
FIGS. 5A-5B depict comparative diffraction of phonon waves within a planar crystal and a plano-convex crystal, respectively, according to some embodiments.
Figure 5B:
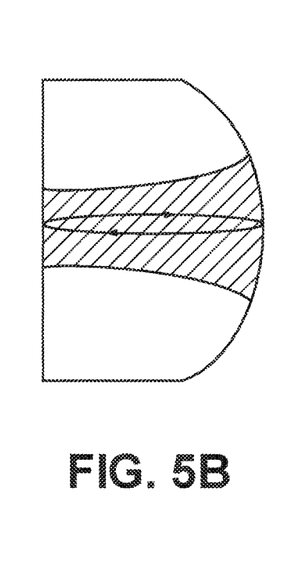

As discussed above, a plano-convex crystal structure may be a particularly advantageous geometry for producing highly coherent acoustic phonon modes because such a structure may minimize or eradicate diffraction losses of acoustic waves within the crystal. As shown in FIG. 5A, acoustic phonon waves in a planar-planar crystal structure suffer diffraction losses when reflecting from an edge of the crystal structure. In contrast, as shown in FIG. 5B, a plano-convex crystal structure acts to reflect acoustic phonon waves from the edges of the crystal in such a way as to reduce diffraction losses.

Figure 5C:
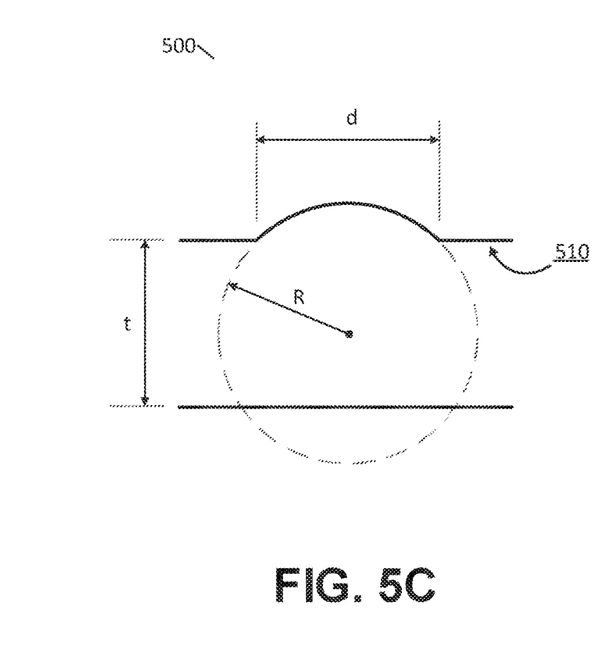
FIG. 5C illustrates dimensions of a convex region of a plano-convex crystal structure, according to some embodiments.

FIG. 5C illustrates dimensions of a convex region of a plano-convex crystal structure, according to some embodiments. Particular values of the radius of curvature R, thickness t, and diameter d of a plano-convex structure may be preferred to increase the stability of phonon modes in the structure, as will be described.

According to some embodiments, within the framework of Gaussian optical resonator design, it may be expected that only certain radii of curvatures will form stable cavities. In a stable optical cavity, transverse spatial confinement of the optical beam may occur as the optical beam is periodically refocused. The cavity represented by a plano-convex crystal structure may be modeled, for example, as a Fabry-Pérot optical cavity.

Stability criteria for a Fabry-Pérot optical cavity in vacuum consisting of two mirrors with radii of curvatures $R_i$ separated by a distance of L is given by $0 \leq g_1 g_2 \leq 1$, where the stability parameters $g_i = 1 - L/R_i$ for i=1,2. According to some embodiments, correctly formulated stability parameters $g_1$ and $g_2$ may be configured to account for the anisotropy of elastic constants. Acoustic beam propagation in a crystalline media can be non-trivial because acoustic dispersion surfaces are not necessarily symmetric and parabolic, which is the case for optical beam propagation in vacuum. In some cases, the acoustic resonator design may be simplified by choosing crystalline axes about which the dispersion surfaces are parabolic and symmetric to first order. In such cases, stability criteria may be formulated that are similar to those of laser beam optics.

The stability parameters for a plano-convex crystal structure (e.g., a structure formed from z-cut quartz and/or x-cut silicon) are given by:

$$g_1 = 1, g_s = 1 - \frac{t}{\chi R}$$

where t is the thickness of the structure, R is the radius of curvature of the convex surface, and $\chi$ is an "anisotropy-constant" that includes the effect of propagation of acoustic beam in an anisotropic medium. For acoustic beam propagation perpendicular to the z-cut face of quartz and x-cut face of silicon, $\chi$ can be calculated analytically yielding $\chi_{Si} = 0.6545$ and $\chi_{Quartz} = 0.5202$. Therefore, the range of radius of curvatures that may produce stable plano-convex phonon cavities is $0 \leq 1 - t/(\chi R) \leq 1$ or equivalently $R \geq t/\chi$. As such, in some embodiments, the radius of curvature R may be selected to be at least 1.5 times the thickness t of the structure, or at least 2 times the thickness t of the structure. For the design of phonon cavities along crystalline axes that produce non-trivial dispersion surfaces, alternative methods such as the numerical acoustic beam propagation techniques may be used.

According to some embodiments, in addition to forming a stable phonon cavity, the radius of curvature R as shown in FIG. 5C may be selected so as to enhance the acousto-optic coupling between the pump and/or probe light and acoustic phonon modes of the crystal. Since this acousto-optic coupling may depend on the overlap integral between the optical and acoustic modes, coupling may be maximized for the fundamental acoustic mode by matching the acoustic beam waist to the optical beam waist. The acoustic waist radius $w_o$ at the planar surface can be expressed in terms of R as:

$$w_o^2 = \frac{t\lambda_{ph}}{\chi^\pi} \sqrt{\frac{g_1 g_2 (1 - g_1 g_2)}{(g_1 + g_2 - 2g_1 g_2)^2}} \quad \text{(Eqn. 3)}$$

where $\lambda_{ph}$ is the wavelength of the phonon mode.

According to some embodiments, a thickness t of a crystal structure and/or a radius of curvature R of the structure may be selected based on a beam radius of pump and/or pump light to be applied to the structure to produce coherent acoustic phonon modes.

As a non-limiting example, a t=1 mm thick plano-convex crystal structure formed from z-cut quartz with R=65 mm may support a 12.66 GHz acoustic mode having a waist radius $w_o$=39.6 μm. By changing R and/or t, the acoustic mode beam waist radius may be adjusted to reduce $w_o$ to be closer to a desired laser beam radius thereby allowing the acoustic mode to couple efficiently to a focused laser beam of a given radius (e.g., 35 μm).

According to some embodiments, the diameter of the crystal structure d as shown in FIG. 5C may be selected to be much larger than the phonon beam waist $w_o$. In at least some cases, such a configuration may cause exponential tails of the acoustic Gaussian beam to be vanishingly small where the convex surface terminates, meaning the diffractive (or anchoring losses) are negligible. For instance, assuming all the energy outside the convex surface is lost to diffractive losses, for $d/w_o$=5 the Q-factor limit due to this loss mechanism would be 7 billion (15 billion) for the phonon cavities fabricated on quartz (silicon). For a crystal structure with given thickness and radius of curvature, Eqn. 3 indicates that phonons at higher frequencies have a smaller waist radius, as $w_o \propto 1/\sqrt{f}$. Therefore, in operation at higher frequencies the phonon mode volume shrinks, which may allow the fabrication of smaller phononic devices.

Figure 6:
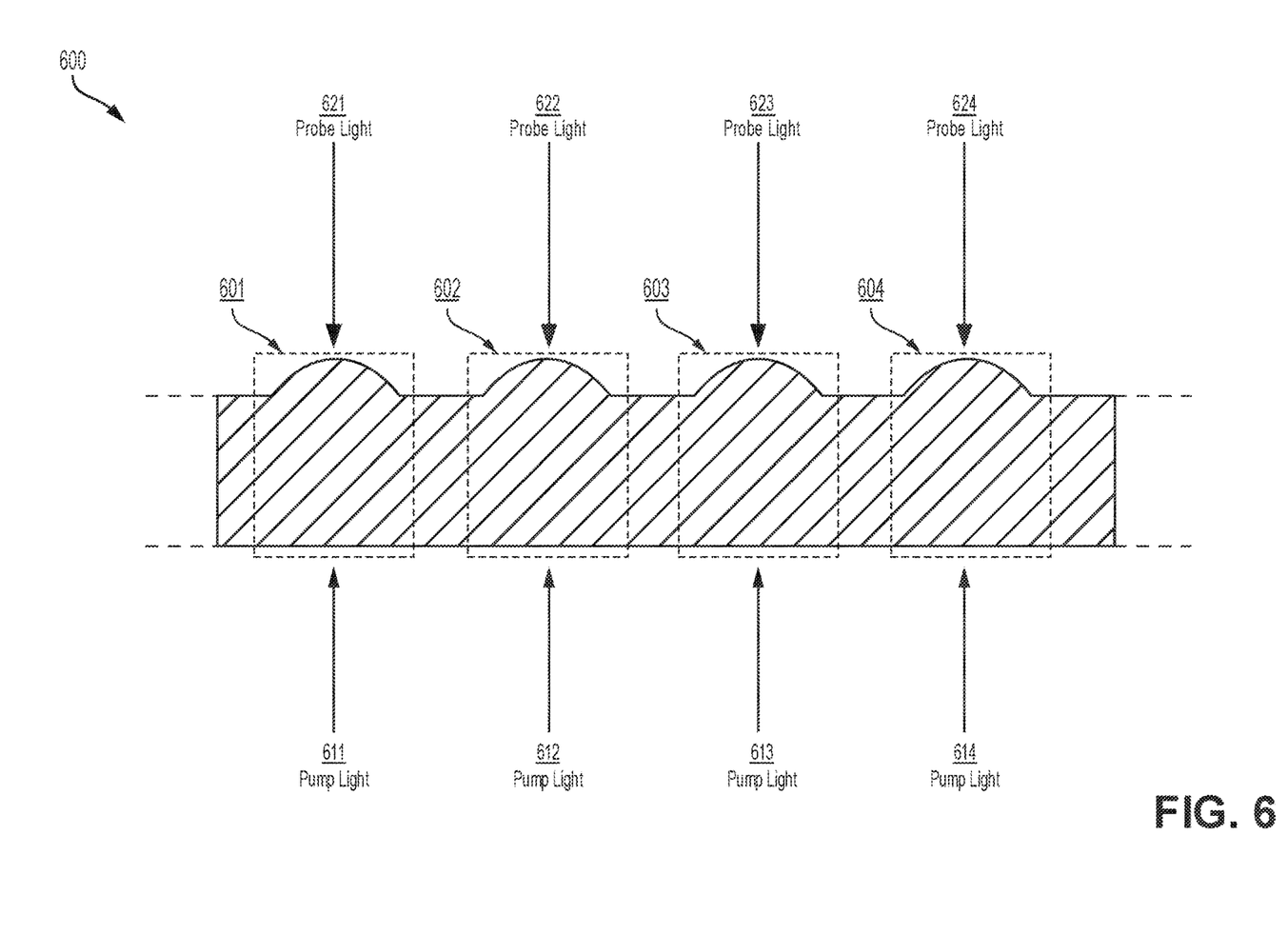
FIG. 6 illustrates a plurality of plano-convex crystal structures fabricated on-chip, according to some embodiments.

As discussed above, a plano-convex crystal structure such as that illustrated in FIG. 1 and described above, may be fabricated on-chip. In some cases, a plurality of such structures may be formed in this manner. For purposes of illustration and not limitation, FIG. 6 illustrates a plurality of plano-convex crystal structures fabricated on-chip, according to some embodiments.

Chip 600 includes a plurality of plano-convex crystal structures 601, 602, 603 and 604 to which corresponding pump light and probe light may be directed to produce coherent acoustic phonon modes as described above. In some embodiments, multiple plano-convex crystal structures on a single chip may receive identical probe light and/or pump light, such as from a collimated laser beam or otherwise. Alternatively, different sources of probe light and/or pump light may be supplied to different plano-convex crystal structures on the same chip to produce different effects within the different structures. In some embodiments, plano-convex crystal structures on a single chip may have different dimensions from one another, such as different radii of curvature R and/or different diameters d (as defined in relation to FIG. 5C, discussed above). In some embodiments, plano-convex crystal structures on a single chip may have a common thickness t.

Figure 7:
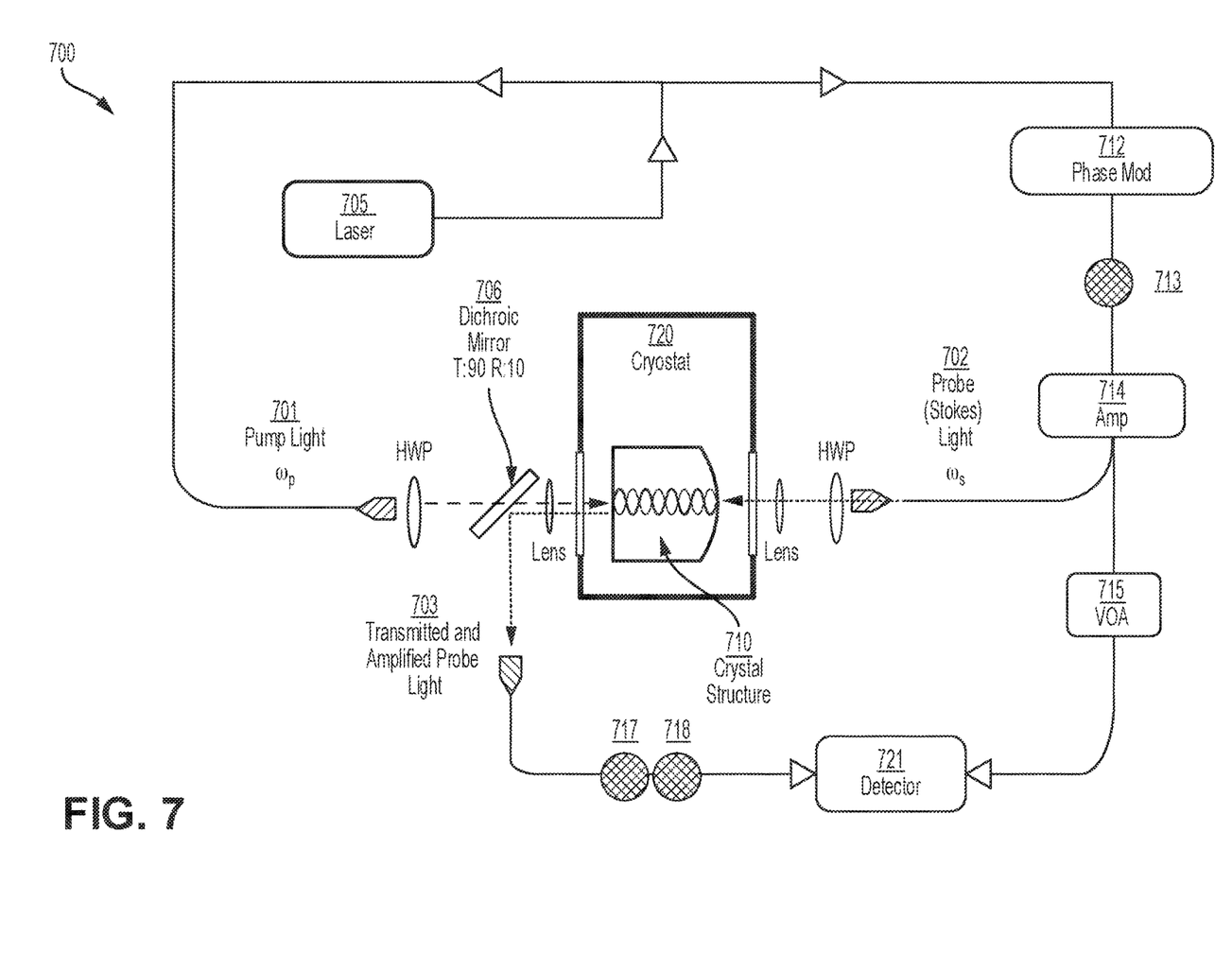
FIG. 7 is a block diagram of an illustrative experimental configuration for generating acoustic phonon modes within a plano-convex crystal, according to some embodiments.

FIG. 7 is a block diagram of an illustrative experimental configuration for generating acoustic phonon modes with a plano-convex crystal, according to some embodiments. While numerous experimental configurations may be envisioned to utilize the above-described techniques to generate acoustic phonon modes having a coherence length at least as large as a crystal structure in which the mode(s) is generated, FIG. 7 is provided as but one illustrative example.

System 700 includes a laser light source 705 that is directed to opposing faces of a plano-convex crystal structure 710. A probe (Stokes) light 702 component of the laser light source is adjusted so that resonances of the crystal structure may be identified and directed to the convex face of the crystal structure, as discussed above. A pump light component 701 of the laser light source is directed to the planar face of the crystal structure. Probe light that passes through the crystal structure is deflected via a dichroic mirror 706 and collected and analyzed by detector 721 to determine the change in power of the probe light and to determine whether the different in frequencies between the probe and pump light have produced a resonant phonon mode in the crystal structure.

In the example of FIG. 7, half-wave plates (labeled "HWP") are used to match the pump and probe polarization states, thereby producing co-polarized light that is applied to opposing sides of the crystal structure. The co-polarization may be achieved in some embodiments by placing a polarizing beam splitter in the path of either or both of the pump light and probe light and examining light so produced from the splitter to determine whether the polarizations are matched. The polarizing beam splitter may then be removed during operation of the apparatus to avoid interfering with propagating light. In the example of FIG. 7, the plano-convex crystal structure 710 is mounted on the cold finger of a cryostat 720, such as a continuous-flow liquid helium cryostat with a 4-K base temperature, and is accessed through two AR-coated fused quartz windows.

In the example of FIG. 7, the pump light and probe light are both derived from the same amplified narrow-linewidth laser source, which is centered around 1550 nm. The pump has a frequency $\omega_p$ which is identical to the source laser and provides ~200 mW of power at the crystal structure 710. Light of the probe frequency $\omega_s$ is created by first modulating the laser source to create new frequencies via phase modulation unit 712, and then by applying a fiber-bragg grating filter 713 to select a single desired frequency. In some embodiments, the phase modulator may be driven with an arbitrary frequency up to some limit (e.g., 20 GHz) which may enable the probe frequency to be swept through the acousto-optical resonance under investigation. Amplifier 714 may be adjusted to produce a desired power of the probe light. In some embodiments, such a power may be the maximum power that can be measured by the detector 721 without damage, such as ~20 mW at the crystal structure 710.

In the example of FIG. 7, the optomechanically amplified probe signal 703 is reflected from a 90:10 dichroic mirror 706 to an output collimator. Since this output collimator may also receive pump light backreflected from the crystal, two additional fiber-bragg grating filters 717 and 718 are used to remove this unwanted light. The resultant signal is input to one port of a balanced detector 721, whereas the other port receives probe light. This probe reference arm is power matched to the signal arm through the use of a variable optical attenuator 715. The output of the balanced detector may be measured with a lockin detector.

In some embodiments, for convenience the probe frequency may be described by the relation $\omega_s=\omega_p-\omega_d\cdot\omega_d$ is adjusted through the Brillouin frequency $\Omega_B$ (thereby producing probe light with frequencies around $\omega_p-\Omega_B$) with some period, such as 1 second. The detector output is measured with an oscilloscope and, in some cases, the accumulating swept optomechanical signal may be averaged over some time window, such as 1 minute. This averaged signal corresponds to the optomechanical susceptibility of the system.

According to some embodiments, additional frequency components of the probe light may be supplied to account for phase noise in the system 700. If the crystal structure 710 were stationary, the relative frequency between the pump light and the probe light would be precise, and as a result the optomechanical response of the crystal structure could be measured with high precision. In many cases, however, there may be ambient vibrations or other sources of movement that cause the crystal structure to move a sufficient amount to create phase noise in the pump and/or probe light.

In some embodiments, phase noise may be accounted for by including a varying frequency component $\omega_{corrected}$ with the probe light in addition to light of the frequency $\omega_s$. Since the pump light reflecting from the vibrating crystal structure would be expected to acquire the same phase noise as the optomechanical response of the crystal structure, the back-reflected pump light may be analyzed to determine a suitable phase noise correction. An error frequency may be determined (e.g., via one or more processors) by determining the beat frequency of the mixed backreflected pump light and probe light. This error frequency may be compared with a stable reference frequency to generate a phase difference as an error signal. The phase of the probe light may be adjusted according to this error signal via phase modulation unit 712. As a result, the new probe light may have an identical frequency response to that of the backreflecting pump light.

Figure 8A:
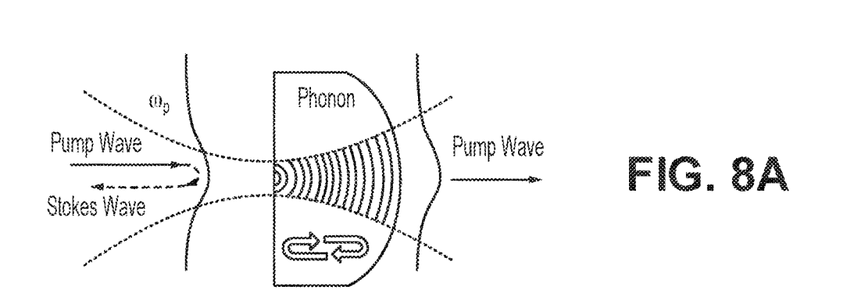
FIG. 8A depicts an incident pump wave and reflected stokes wave from a crystal structure, according to some embodiments.
Figure 8B:
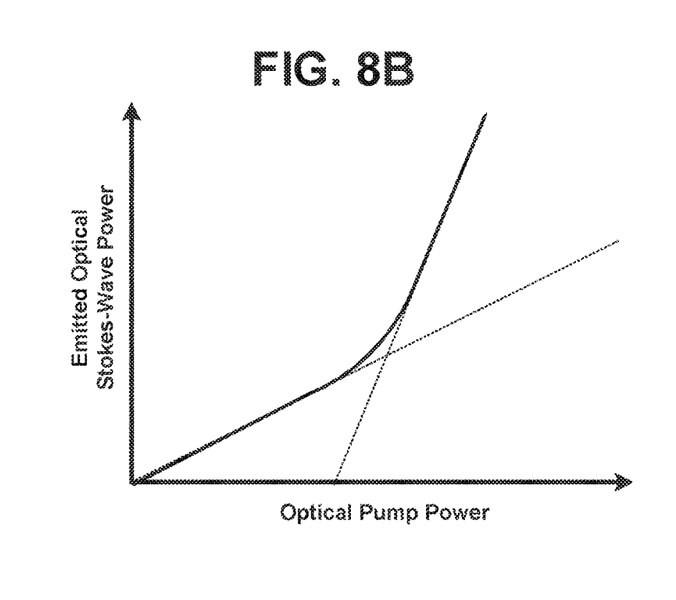
FIG. 8B depicts a qualitative rate of change in emitted stokes wave power from the crystal structure of FIG. 8A as a function of optical pump power, according to some embodiments.
Figure 8C:
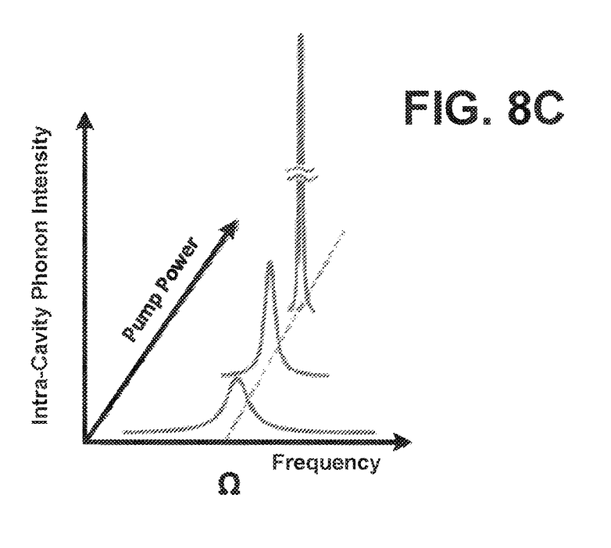
FIG. 8C depicts a narrowing bandwidth of phonon mode intensity as a function of pump wave power, according to some embodiments.

In some embodiments, coherent acoustic phonon modes may be produced in a plano-convex crystal structure that exhibit lasing behavior. To illustrate this phenomenon further, FIGS. 8A-8C present the behavior of such a device.

According to some embodiments, phonon laser oscillation may be produced by propagating pump light through a plano-convex crystal structure, as discussed above and as illustrated in FIG. 8A. Provided that the plano-convex crystal structure interacts with the impinging pump light for a sufficient number of optical wavelengths (e.g., greater than 10,000 optical wavelengths), dispersive symmetry breaking between Stokes and anti-Stokes processes may amplify the Stokes phonon mode. The threshold conditions for lasing may be comparable to that of an optical laser, such that the onset of phonon laser oscillation may require that the round-trip phonon loss and amplification are balanced. Note that a counter-propagating probe light source is not necessarily required for this lasing behavior to function so long as the phonon mode is sufficiently amplified by Stokes processes produced by the pump light.

Since each Stokes phonon generated in the plano-convex crystal structure also yields a red-shifted Stokes photon (labeled "Stokes wave" in FIG. 8A) emitted Stokes waves provide a direct measure of the phonon generation rate within the cavity. By simply detecting the emitted Stokes wave power, the transition from spontaneous phonon emission to phonon-laser operation may be observed. This behavior is illustrated qualitatively in FIG. 8B, where it can be seen that the power of pump light applied to the crystal causes a dramatic increase in the power of the emitted Stokes wave beyond a critical pump light power.

Moreover, since the circulating phonons imprint the spectral content of the intra-cavity phonon mode on the scattered Stokes wave, the intra-cavity phonon spectrum can be conveniently recovered through interference with pump light. This yields a heterodyne power spectrum which is a mirror of the intra-cavity phonon spectrum. As illustrated in FIG. 8C, for powers below a threshold, the observed phonon linewidth will approach that of the Lorentzian response described above in relation to FIG. 2C. Above threshold, however, the spectrum may reveal a dramatic line-narrowing (rightmost peak in FIG. 2C), which is a tell-tale sign of laser oscillation.

According to some embodiments, a phonon lasing threshold may be determined by solving the coupled mode equations involving the pump field, Stokes field and left and right moving phonon fields within the crystal structure. This results in the four coupled mode equations under slowly varying envelope approximation are solved self-consistently so that the phonon field is continuous at the boundaries.

Figure 9A:
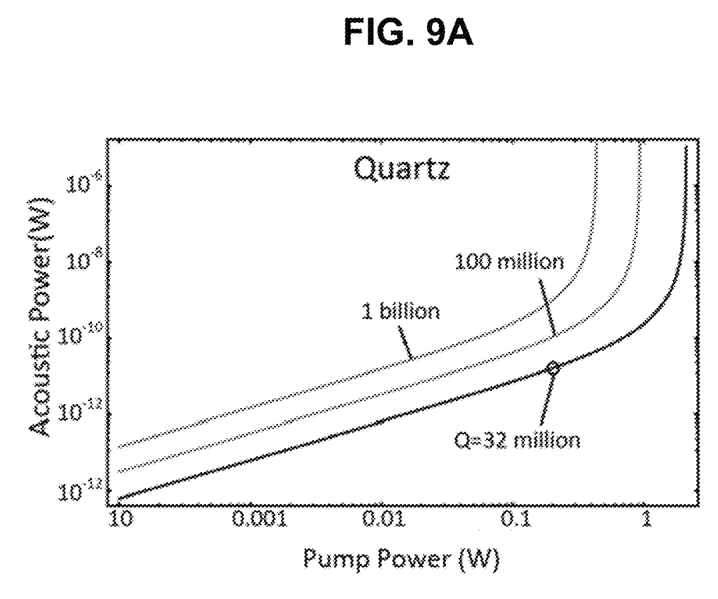
FIG. 9A is a graph of an expected relationship between pump power and acoustic power within a quartz crystal structure, according to some embodiments.
Figure 9B:
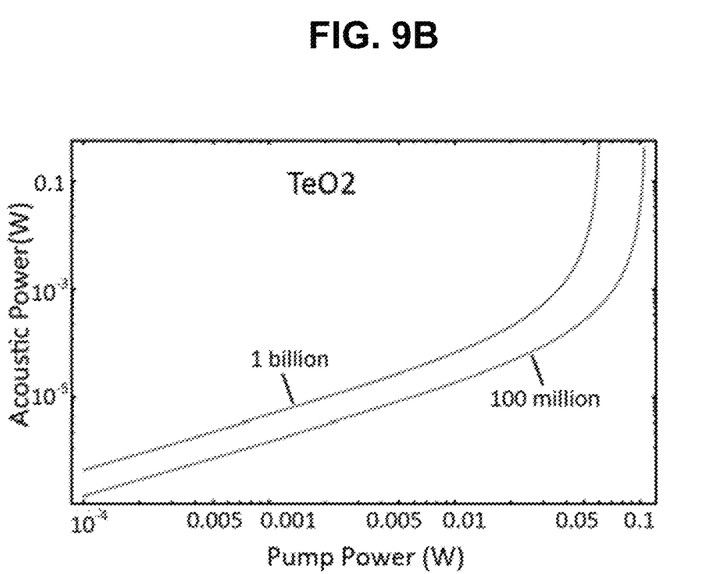
FIG. 9B is a graph of an expected relationship between pump power and acoustic power within a $TeO_2$ crystal structure, according to some embodiments.

FIGS. 9A and 9B depict expected acoustic power of a phonon laser so produced as a function of the pump light power, according to some embodiments, where FIG. 9A illustrates an expected response for a plano-convex crystal structure formed from Quartz, and FIG. 9B illustrates an expected response for a plano-convex crystal structure formed from $TeO_2$. It may be noticed from FIG. 9A that a laser threshold occurs at around 1.5 Watts in Quartz. Alternatively, the photoelastic and phononic properties of $TeO_2$ make it a prime candidate for low power phonon lasing. It may be noted that owing to the dramatically enhanced photon-phonon coupling produced by these (and other) materials, threshold phonon laser powers as low as a few milliwatts may be achievable.

Having thus described several aspects of at least one embodiment of this invention, it is to be appreciated that various alterations, modifications, and improvements will readily occur to those skilled in the art.

Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Further, some actions are described as taken by a "user." It should be appreciated that a "user" need not be a single individual, and that in some embodiments, actions attributable to a "user" may be performed by a team of individuals and/or an individual in combination with computer-assisted tools or other mechanisms.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A resonator, comprising:
    a plano-convex crystal structure having at least a planar face and a convex face;
    at least one pump input arranged to supply light to the planar face of the plano-convex crystal structure; and
    at least one controller configured to direct light onto the planar face of the plano-convex crystal structure via the at least one pump input such that the light propagates through the plano-convex crystal structure from the planar face to the convex face and produces a coherent acoustic phonon mode across the plano-convex crystal structure.

2. The resonator of claim 1, wherein the light includes light of a first frequency and wherein the plano-convex crystal structure is transparent to at least light of the first frequency.

3. The resonator of claim 1, wherein the plano-convex crystal structure is transparent to visible light.

4. The resonator of claim 1, further comprising a cryogenic system thermally coupled to the plano-convex crystal structure and configured to cool the plano-convex crystal structure to a temperature below 50 K.

5. The resonator of claim 1, wherein the plano-convex crystal structure comprises $TeO_2$ and/or $SiO_2$.

6. The resonator of claim 1, wherein the plano-convex crystal structure comprises z-cut quartz.

7. The resonator of claim 1, wherein the plano-convex crystal structure comprises diamond and/or sapphire.

8. The resonator of claim 1, wherein the at least one pump input comprises an optical fiber.

9. The resonator of claim 1, further comprising at least one probe input arranged to supply light to the convex face of the plano-convex crystal structure.

10. The resonator of claim 9, wherein the at least one probe input and the at least one pump input are configured to supply co-polarized light to the plano-convex crystal structure.

11. The resonator of claim 1, further comprising a wafer and wherein portions of two opposing faces of the wafer form the plano-convex crystal structure.

12. A method of producing coherent acoustic phonon modes within a plano-convex crystal structure having a planar face and a convex face, the method comprising:
    supplying pump light to the planar face of the plano-convex crystal structure such that the pump light propagates through the plano-convex crystal structure from the planar face to the convex face and produces a coherent acoustic phonon mode across the plano-convex crystal structure.

13. The method of claim 12, wherein the acoustic phonon mode has a frequency above 1 GHz.

14. The method of claim 12, wherein the pump light includes light of a first frequency and wherein the plano-convex crystal structure is transparent to at least light of the first frequency.

15. The method of claim 14, wherein the plano-convex crystal structure is transparent to visible light.

16. The method of claim 12, wherein the plano-convex crystal structure comprises $TeO_2$ and/or $SiO_2$.

17. The method of claim 12, wherein a coherence length of the coherent acoustic phonon mode is greater than a length of the plano-convex crystal structure as measured from the planar face to the convex face of the crystal.

18. The method of claim 12, further comprising supplying probe light to the convex face of the plano-convex crystal structure, wherein the pump light is of a first frequency and the probe light is of a second frequency, and wherein the first frequency and second frequency are different.

19. The method of claim 18, wherein the probe light and the pump light are co-polarized.

20. The method of claim 18, further comprising selecting the first frequency and the second frequency based at least in part on a Brillouin frequency of the plano-convex crystal structure.

* * * * *